(12) United States Patent
Shin et al.

(10) Patent No.: US 10,831,056 B2
(45) Date of Patent: Nov. 10, 2020

(54) DISPLAY DEVICE

(71) Applicant: Samsung Display Co., Ltd., Yongin-si (KR)

(72) Inventors: Ki Chul Shin, Seongnam-si (KR); Seon-Ah Cho, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 247 days.

(21) Appl. No.: 15/984,793

(22) Filed: May 21, 2018

(65) Prior Publication Data
US 2019/0113799 A1  Apr. 18, 2019

(30) Foreign Application Priority Data
Oct. 17, 2017 (KR) .......................... 10-2017-0134709

(51) Int. Cl.
| | | |
|---|---|---|
| *G02F 1/1335* | (2006.01) | |
| *G02F 1/1368* | (2006.01) | |
| *G02F 1/1337* | (2006.01) | |
| *G02F 1/13363* | (2006.01) | |
| *H01L 27/12* | (2006.01) | |
| *C09B 23/06* | (2006.01) | |
| *C09B 23/08* | (2006.01) | |
| *C09B 47/04* | (2006.01) | |

(52) U.S. Cl.
CPC ........ *G02F 1/133514* (2013.01); *C09B 23/06* (2013.01); *C09B 23/083* (2013.01); *G02F 1/1337* (2013.01); *G02F 1/1368* (2013.01); *G02F 1/13363* (2013.01); *G02F 1/133528* (2013.01); *H01L 27/1214* (2013.01); *C09B 47/04* (2013.01); *G02F 2001/133541* (2013.01); *G02F 2001/133548* (2013.01); *G02F 2001/133638* (2013.01); *G02F 2201/121* (2013.01); *G02F 2201/123* (2013.01)

(58) Field of Classification Search
CPC ......... G02F 1/133514; G02F 1/133528; G02F 1/13363; G02F 2202/04; G02F 1/133516; G02B 5/201; G02B 5/223; G03F 7/0007
USPC .............................................. 430/7; 349/106
See application file for complete search history.

(56) References Cited

U.S. PATENT DOCUMENTS

| | | | | |
|---|---|---|---|---|
| 6,333,596 B1 * | 12/2001 | Shim | ....................... | B32B 27/36 |
| | | | | 313/479 |
| 2017/0255055 A1 * | 9/2017 | Liang | ................ | G02F 1/133621 |

FOREIGN PATENT DOCUMENTS

| | | |
|---|---|---|
| KR | 10-2013-0062572 A | 6/2013 |
| KR | 10-2013-0079804 A | 7/2013 |

(Continued)

*Primary Examiner* — John A McPherson
(74) *Attorney, Agent, or Firm* — Lewis Roca Rothgerber Christie LLP

(57) ABSTRACT

An exemplary embodiment of the present invention provides a display device including: a thin film transistor array panel; an anti-reflective layer overlapping the thin film transistor array panel; and a color conversion display panel positioned between the thin film transistor array panel and the anti-reflective layer, wherein: the color conversion display panel may include a color conversion layer including a semiconductor nanocrystal and a transmissive layer; the anti-reflective layer may include an adhesive layer positioned on the color conversion display panel, a low-reflective layer overlapping the adhesive layer, and a base film positioned between the adhesive layer and the low-reflective layer. A dye is present in one of the layers of the anti-reflective layer.

18 Claims, 6 Drawing Sheets

(56) References Cited

FOREIGN PATENT DOCUMENTS

| KR | 10-2016-0066400 A | 6/2016 |
| KR | 10-2016-0095996 A | 8/2016 |
| KR | 10-1678275 B1 | 11/2016 |

* cited by examiner

DISPLAY DEVICE

CROSS-REFERENCE TO RELATED APPLICATION

This application claims priority to and the benefit of Korean Patent Application No. 10-2017-0134709 filed in the Korean Intellectual Property Office on Oct. 17, 2017, the entire content of which is incorporated herein by reference.

BACKGROUND (a) Field

The disclosure relates to a display device.

(b) Description of the Related Art

A liquid crystal display may include two field generating electrodes, a liquid crystal layer, a color filter, and a polarization layer. Although light generated from a light source reaches a user through the liquid crystal layer, the color filter, and the polarization layer, light loss may be generated in the polarization layer, the color filter, and the like. The light loss may also be generated in a display device such as an organic light emitting diode display and the like as well as the liquid crystal display.

To realize a display device having high color reproducibility while decreasing light loss, a display device including a color conversion display panel using a semiconductor nanocrystal has been proposed.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a display device that may improve color reproducibility and luminance.

An exemplary embodiment of the present invention provides a display device including: a thin film transistor array panel; an anti-reflective layer overlapping the thin film transistor array panel; and a color conversion display panel positioned between the thin film transistor array panel and the anti-reflective layer, wherein: the color conversion display panel may include a color conversion layer including a semiconductor nanocrystal and a transmissive layer; the anti-reflective layer may include an adhesive layer positioned on the color conversion display panel, a low-reflective layer overlapping the adhesive layer, and a base film positioned between the adhesive layer and the low-reflective layer, The anti-reflective layer also includes a dye in one or more of the adhesive layer, the low-reflective layer, and the base film.

The color conversion display panel may emit blue light having a wavelength of 450 nm to 460 nm, green light having a wavelength of 540 nm to 550 nm, and red light having a wavelength of 630 nm to 640 nm.

The dye may include at least one of a first dye absorbing light having a wavelength of 480 nm to 520 nm, a second dye absorbing light having a wavelength of 580 nm to 620 nm, and a third dye absorbing light having a wavelength of 680 nm to 720 nm.

The dye may include at least one of compounds represented by Chemical Formulas 1 to 7.

[Chemical Formula 1]

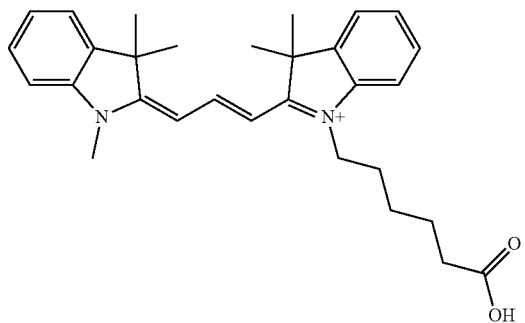

[Chemical Formula 2]

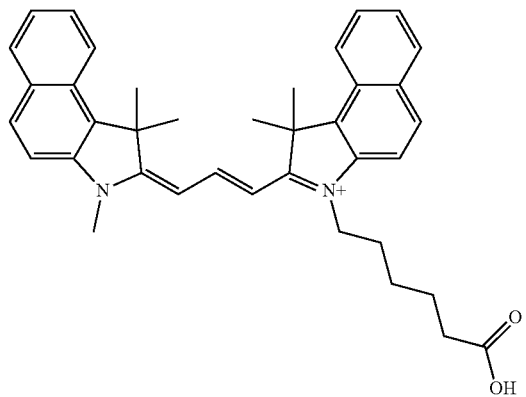

[Chemical Formula 3]

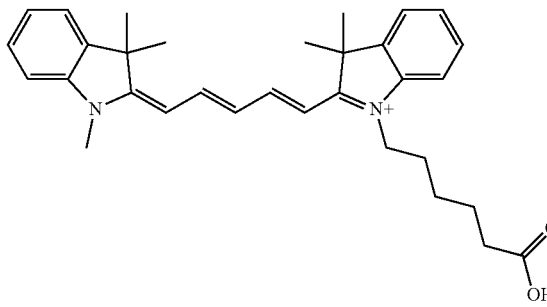

[Chemical Formula 4]

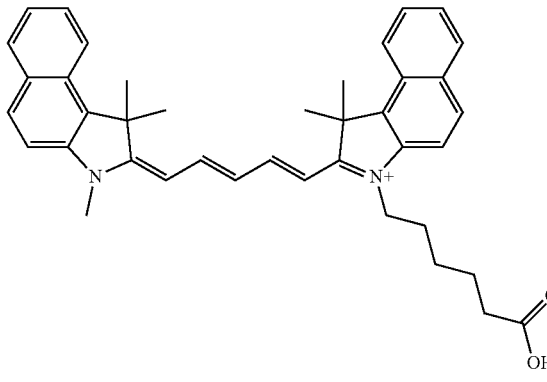

-continued

[Chemical Formula 5]

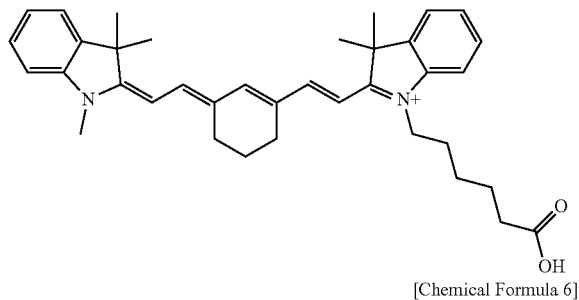

[Chemical Formula 6]

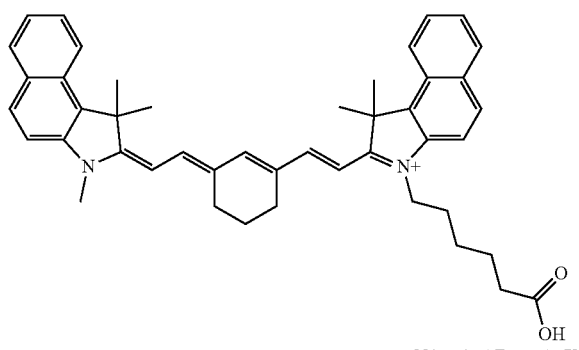

[Chemical Formula 7]

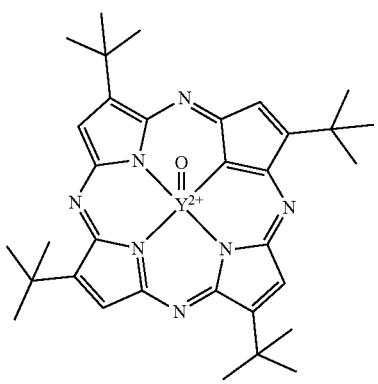

A weight percentage of the second dye may be larger than those of the first dye and the third dye.

A weight ratio of the second dye and the first dye may be 5:1 to 5:2.

A weight ratio of the second dye and the third dye may be 5:1 to 5:2.

The anti-reflective layer may include a phase retardation layer and a linear polarization layer positioned between the adhesive layer and the base film.

The phase retardation layer may include the dye.

The adhesive layer may include the dye.

Another embodiment of the present disclosure provides a display device including: a thin film transistor array panel; an anti-reflective layer overlapping the thin film transistor array panel; and a color conversion display panel positioned between the thin film transistor array panel and the anti-reflective layer, wherein: the color conversion display panel may include a color conversion layer including a semiconductor nanocrystal and a transmissive layer; the anti-reflective layer may include an adhesive layer positioned on the color conversion display panel, a low-reflective layer overlapping the adhesive layer, and a base film positioned between the adhesive layer and the low-reflective layer; and the anti-reflective layer may absorb light having a first wavelength of 480 nm to 520 nm, light having a second wavelength of 580 nm to 620 nm, and light having a third wavelength of 680 nm to 720 nm.

According to the embodiment of the inventive concept, it is possible to provide a display device capable of improving color reproducibility and luminance.

DETAILED DESCRIPTION OF THE EMBODIMENTS

Figure 1:
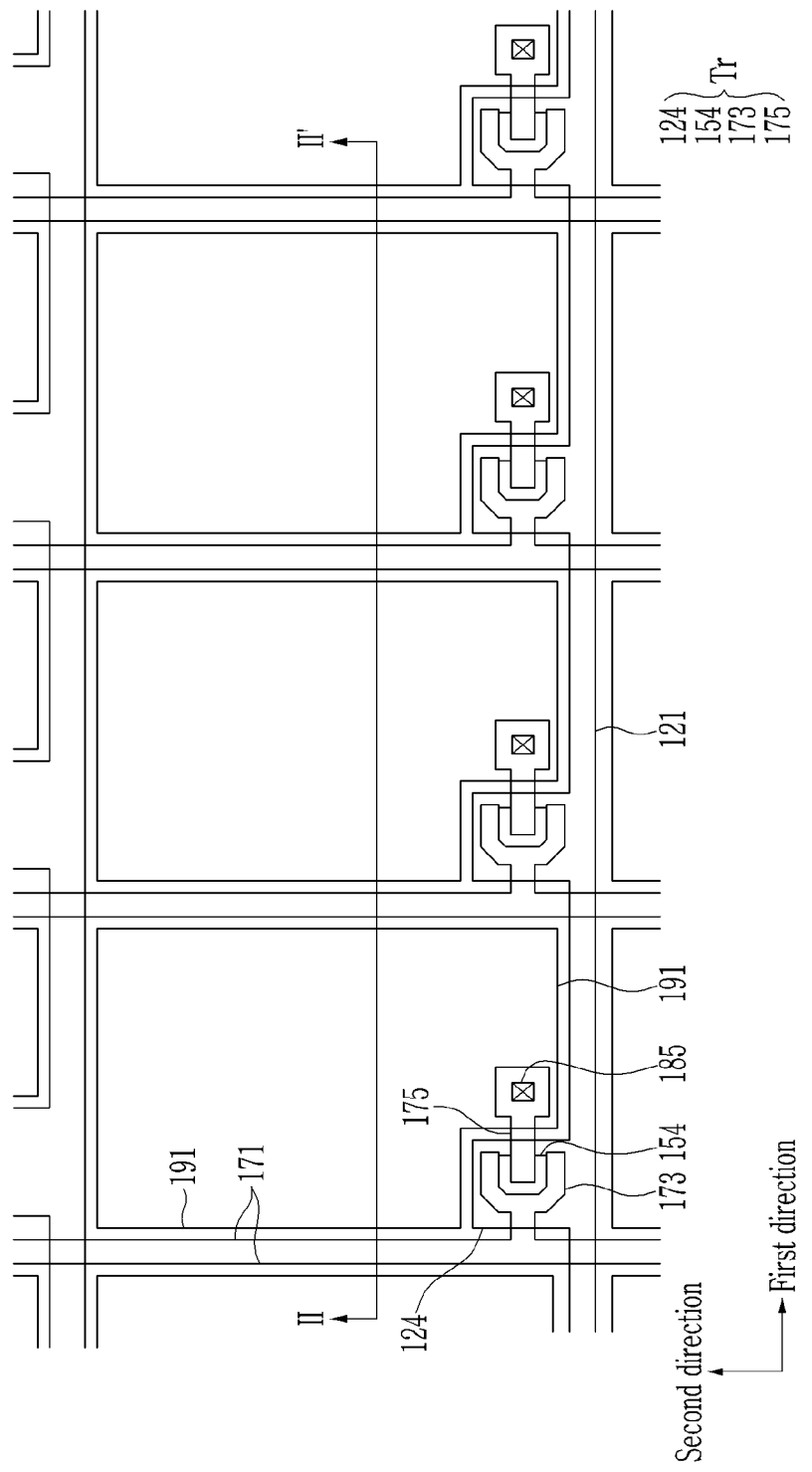
FIG. 1 illustrates a top plan view of a pixel of a display device according to an exemplary embodiment.

The present disclosure will be described more fully hereinafter with reference to the accompanying drawings, in which exemplary embodiments are shown. As those skilled in the art would realize, the described embodiments may be modified in various different ways, all without departing from the spirit or scope of the present inventive concept.

To clearly describe the inventive concept, portions which do not relate to the description are omitted, and like reference numerals designate like elements throughout the specification.

Further, the size and thickness of each component shown in the drawings are arbitrarily shown for better understanding and ease of description, but the inventive concept is not limited thereto. In the drawings, the thickness of layers, films, panels, regions, etc. are exaggerated for clarity. For better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

Figure 2:
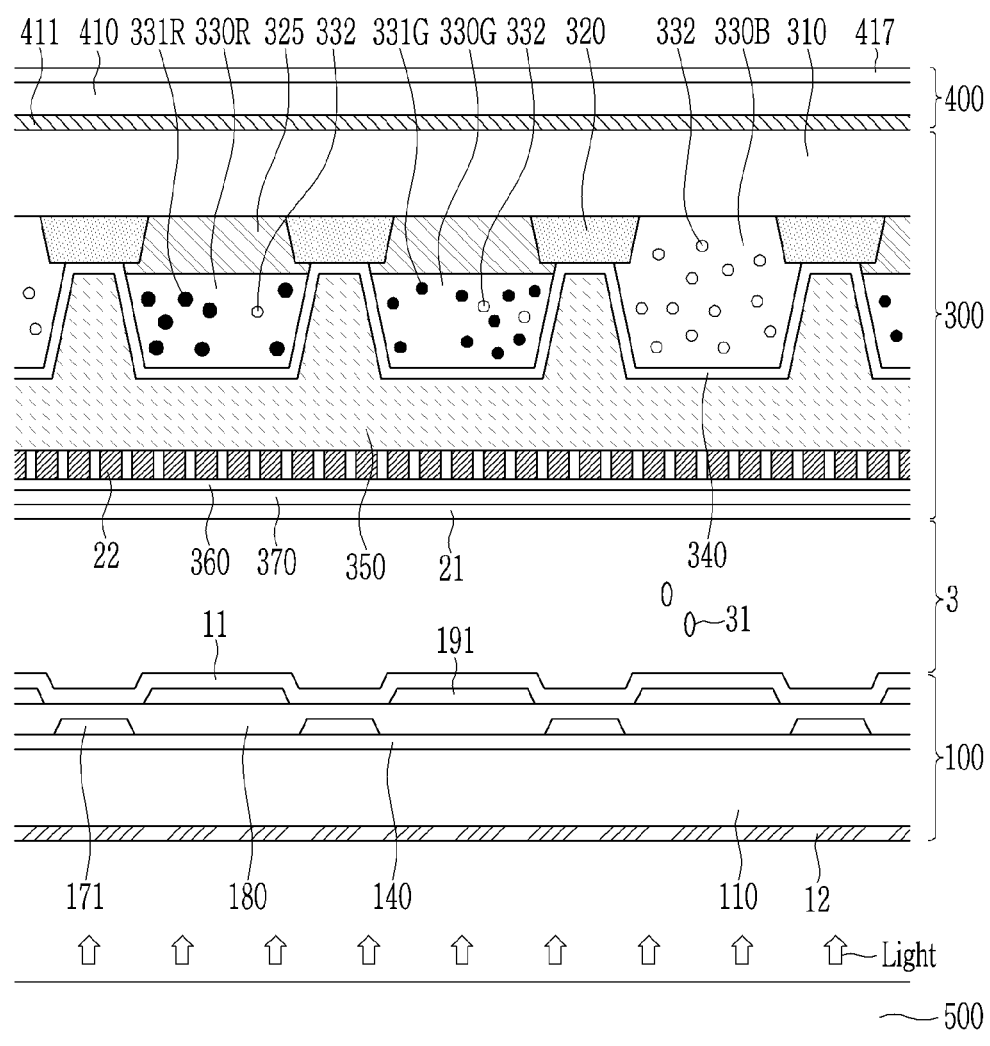
FIG. 2 illustrates a cross-sectional view taken along line II-IP of FIG. 1.

Hereinafter, a display device according to an exemplary embodiment of the inventive concept will be described with reference to FIG. 1 and FIG. 2. FIG. 1 illustrates a top plan view of a pixel of a display device according to an exemplary embodiment, and FIG. 2 illustrates a cross-sectional view taken along line II-IP of FIG. 1.

A display device according to an exemplary embodiment includes a light unit 500, a thin film transistor array panel 100, an anti-reflective layer 400 being spaced from and overlapping the thin film transistor array panel 100, a color conversion display panel 300 positioned between the thin film transistor array panel 100 and the anti-reflective layer 400, and a liquid crystal layer 3 positioned between the thin film transistor array panel 100 and the color conversion display panel 300.

Hereinafter, the anti-reflective layer 400 will be first described.

The anti-reflective layer 400 is positioned on the other surface opposite to one surface of the color conversion display panel 300 facing the liquid crystal layer 3. The one surface and the other surface of the color conversion display panel 300 may face each other along a third direction.

The anti-reflective layer 400 includes an adhesive layer 411 positioned on the color conversion display panel 300. The adhesive layer 411 may overlap a front surface of a substrate 310 of the color conversion display panel 300. The adhesive layer 411 may combine a base film 410 and the substrate 310.

The adhesive layer 411 may include an acrylic resin, a thermoplastic resin, or a polyurethane resin, but is not limited thereto, and any material for bonding is possible.

The adhesive layer 411 according to an exemplary embodiment includes a dye. The dye may absorb light of a peripheral wavelength band excluding a central wavelength band of light emitted from the color conversion display panel 300, thereby providing light having better color reproducibility.

Specifically, a central wavelength of the blue light emitted from the color conversion display panel 300 may be about 450 nm to about 460 nm, a central wavelength of green light thereof may be about 540 nm to about 550 nm, and a central wavelength of red light thereof may be about 630 nm to 640 nm. The dye contained in the adhesive layer 411 may absorb light having a first wavelength of 480 nm to 520 nm, absorb light having a second wavelength of 580 nm to 620 nm, and absorb light having a wavelength of about 680 nm to 720 nm.

The dye may include at least one of a first dye that absorbs the light having the first wavelength, a second dye that absorbs the light having the second wavelength, and a third dye that absorbs the light having the third wavelength. The adhesive layer 411 may absorb the light of the peripheral wavelength band such as the first wavelength to the third wavelength except for the central wavelength of the light emitted from the color conversion display panel 300, and may allow light transmittance in the first to third wavelength bands to be 80% or less. Thus, since light concentrated in the central wavelength band is emitted, it is possible to provide light with improved color reproducibility.

The dye may include at least one of compounds represented by Chemical Formulas 1 to 7. Particularly, the compounds represented by Chemical Formulas 1 and 2 may be the first dye absorbing the light having the first wavelength, the compounds represented by Chemical Formulas 3 and 4 may be the second dye absorbing the light having the second wavelength, and the compounds represented by Chemical Formulas 5 and 6 may be the third dye absorbing the light having the third wavelength.

The compound represented by Chemical Formula 7 may be the second dye absorbing the light having the second wavelength. Although not shown herein, the compound represented by Chemical Formula 7 may absorb the light having the first wavelength or the light having the third wavelength by controlling the number of double bonds included in the compound.

[Chemical Formula 1]

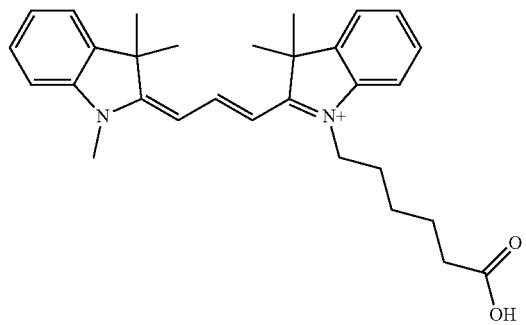

[Chemical Formula 2]

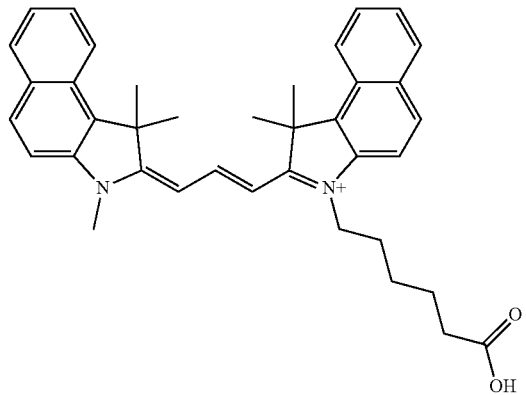

[Chemical Formula 3]

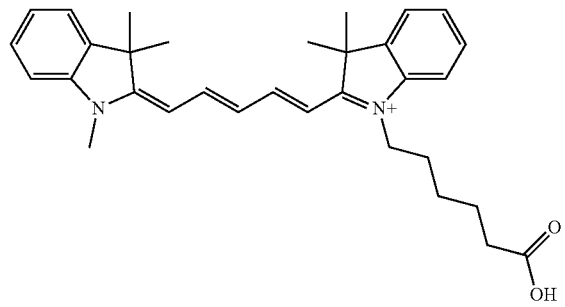

[Chemical Formula 4]

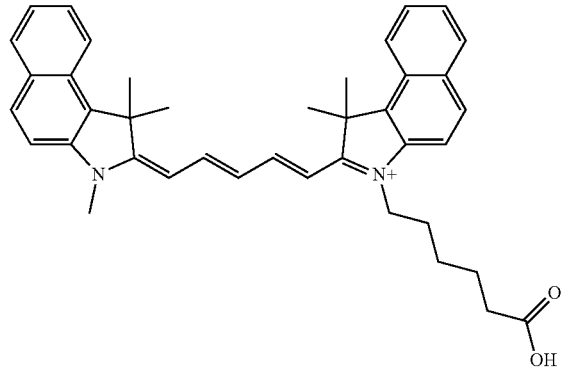

-continued

[Chemical Formula 5]

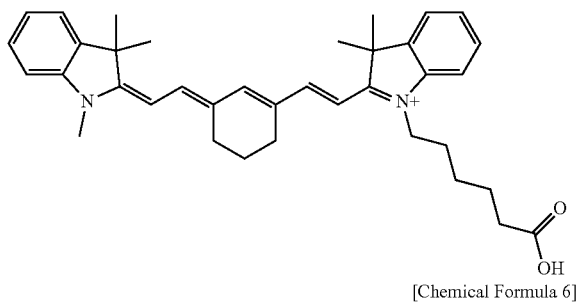

[Chemical Formula 6]

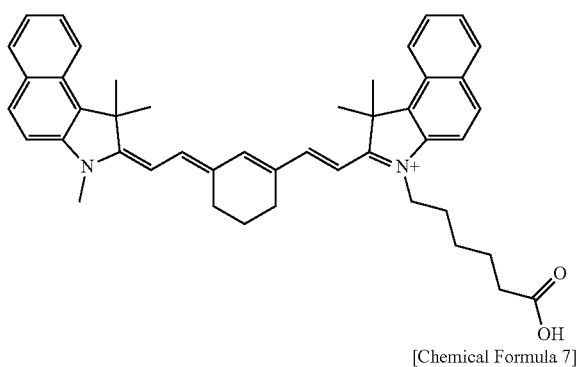

[Chemical Formula 7]

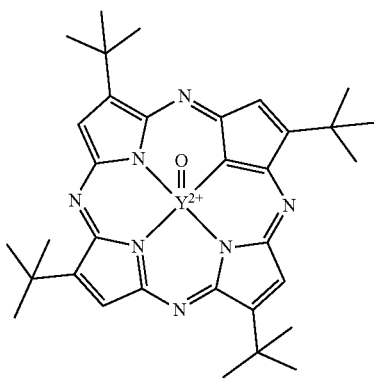

The second dye may be included in the adhesive layer 411 to have a larger weight percentage (wt %) than the first dye and the third dye. Specifically, a weight ratio of the second dye to the first dye may be about 5:1 to about 5:2, and a weight ratio of the second dye to the third dye may be about 5:1 to about 5:2.

Since the color conversion display panel 300 according to the exemplary embodiment of the inventive concept may include a blue light cutting filter 325 including a yellow filter, a display area may display yellow light. Since the second dye absorbing the light of the wavelength band displaying the yellow color is contained at a larger content than the first dye and the third dye, the second dye may absorb the yellow light emitted to the outside of the display device, and it is possible to reduce a phenomenon that the yellow light appears in the display area.

Although the exemplary embodiment in which the second dye is contained at more than the first dye and the third dye to reduce the phenomenon that the display device displays the yellow light in the present specification, the present disclosure is not limited thereto, and in some exemplary embodiments, an amount of the first dye may be the largest or an amount of the third dye may be the largest.

The base film 410 and a low-reflective layer 417 are positioned on the adhesive layer 411. The base film 410 and the low-reflective layer 417 may overlap a front surface of the substrate 310.

The base film 410, which supports the low-reflective layer 417, may include any polymer material.

The low-reflective layer 417 may reduce reflection of external light to improve luminance of the display device. The low-reflective layer 417 may include any layer for reducing the reflection of the external light, but a plurality of layers, for example, having different refractive indexes, may be stacked. A layer having a low refractive index may be stacked at the outside of the display device to be adjacent thereto, and a layer having a high refractive index may be stacked at the substrate 310 to be adjacent thereto. Destructive interference between light reflected on respective layers occurs, thus the reflection of the external light may be reduced.

For example, the low-reflective layer 417 may have a structure in which metal layers and dielectric layers are alternately stacked. The dielectric layer may include at least one of $SiO_2$, $CaF_2$, $MgF_2$, LiF, $SiN_x$, SiCN, SiON, $Ta_xO_y$, and $TiO_x$, and the metal layer may include at least one of Al, Mo, Cr, W, Ti, Ag, Ni, Co, Cu, $CrN_x$, $TiN_x$, NiS, $MoO_x$, $CrO_x$, and $WO_x$. Herein, x and y are factors that determine a chemical composition ratio, and may be changed according to process conditions and the like.

The low-reflective layer 417 is not limited to the above-described structure, and may be an anti-glare layer or a hard coating layer for preventing the base film 410 from being damaged.

A conventional display device may include a circular polarization layer positioned on one surface of the display device to reduce the reflection of the external light. In this case, the reflection of the external light is reduced, but the luminance of the display device may be reduced to 60 to 70%. In addition, it is difficult to control transmittance according to individual wavelengths, so a reflective color of the display device may display yellow light.

However, the display device according to the exemplary embodiment includes the anti-reflective layer containing the dye without including a separate circular polarization layer, thereby reducing the reflection of the external light and improving the luminance and color reproducibility of the display device.

The light unit 500 is positioned at a rear surface of the thin film transistor array panel 100 along the third direction. The light unit 500 may include a light source for generating light, and a light guide plate (not shown) for receiving the light and guiding the received light toward the thin film transistor array panel 100.

The light unit 500 may include any light source emitting blue light, and may include a light emitting diode (LED) as an example. Instead of the light unit 500 including the blue light source, the light unit 500 may include a white light source or an ultraviolet ray light source. However, the display device using the light unit 500 including the blue light source will be described hereinafter.

The light source may be an edge type disposed on at least one lateral surface of the light guide or a direct type positioned directly below the light guide, but is not limited thereto.

The thin film transistor array panel 100 includes a first polarization layer 12 positioned between a first substrate 110 and the light unit 500. The first polarization layer 12 polarizes light incident from the light unit 500 to the first substrate 110.

The first polarization layer 12 may be at least one of a deposited polarization layer, a coated polarization layer, and a wire grid polarization layer, but is not limited thereto. In addition, the first polarization layer 12 may be formed on one surface of the first substrate 110 by various methods such as in a film form, a coating form, a printing form, and the like, but is not limited thereto.

The thin film transistor array panel 100 may include a gate line 121 extending in a first direction between the first substrate 110 and the liquid crystal layer 3 and including a gate electrode 124, a gate insulating layer 140 positioned between a gate line 121 and the liquid crystal layer 3, a semiconductor layer 154 positioned between the gate insulating layer 140 and the liquid crystal layer 3, a data line 171 positioned between the semiconductor layer 154 and the liquid crystal layer 3 and extending in a second direction, a source electrode 173 connected to the data line 171, a drain electrode 175 separated from the source electrode 173, and a passivation layer 180 positioned between the data line 171 and the liquid crystal layer 3.

The semiconductor layer 154 forms a channel in a portion that is not covered by the source electrode 173 and the drain electrode 175, and the gate electrode 124, the semiconductor layer 154, the source electrode 173, and the drain electrode 175 form one thin film transistor Tr.

A pixel electrode 191 is positioned on the passivation layer 180. The pixel electrode 191 may be physically and electrically connected to the drain electrode 175 through a contact hole 185 formed in the passivation layer 180.

A first alignment layer 11 may be positioned between the pixel electrode 191 and the liquid crystal layer 3.

The color conversion display panel 300 includes the substrate 310 overlapping the thin film transistor array panel 100. A light blocking member 320 is positioned between the substrate 310 and the thin film transistor array panel 100. Specifically, the light blocking member 320 is positioned between the substrate 310 and red and green color conversion layers 330R and 330G described later, and between the substrate 310 and a transmissive layer 330B.

The light blocking member 320 may be positioned between the red color conversion layer 330R and the green color conversion layer 330G, between the green color conversion layer 330G and the transmissive layer 330B, and between the transmissive layer 330B and the red color conversion layer 330R along the first direction. In addition, the light blocking member 320 may be positioned between red color conversion layers 330R that are adjacent to each other, green color conversion layers 330G that are adjacent to each other, and transmissive layers 330B that are adjacent to each other. The light blocking member 320 may have a lattice shape or a straight line shape in a plan view.

The light blocking member 320 may prevent mixture of different light emitted from adjacent pixels, and may partition regions in which the red color conversion layer 330R, the green color conversion layer 330G, and the transmissive layer 330B are disposed. The light blocking member 320 may be made of any material capable of blocking (reflecting or absorbing) light.

The blue light cutting filter 325 may be positioned between the substrate 310 and the light blocking member 320, and the thin film transistor array panel 100. The blue light cutting filter 325 may be positioned between the red color conversion layer 330R and the substrate 310 and between the green color conversion layer 330G and the substrate 310. The blue light cutting filter 325 may overlap regions emitting red and green light, and may not overlap a region emitting blue light.

The blue light cutting filter 325 includes a first region overlapping the red color conversion layer 330R and a second region overlapping the green color conversion layer 330G, and these regions may be connected to each other. However, the inventive concept is not limited thereto, and the first region and the second region may be formed to be separated from each other. When the first region and the second region are positioned to be separated from each other, separated blue light cutting filters 325 may include different materials from each other.

The blue light cutting filter 325 may block the blue light supplied from the light unit 500. The blue light incident from the light unit 500 to the red color conversion layer 330R and the green color conversion layer 330G is converted into red or green light by semiconductor nanocrystals 331R and 331G, and some blue light may not be converted but is emitted. The blue light emitted without conversion is mixed with the red light or the green light, thus color reproducibility may deteriorate. The blue light cutting filter 325 may block (absorb or reflect) the blue light supplied from the light unit 500 from being emitted through the substrate 310 without absorption in the red color conversion layer 330R and the green color conversion layer 330G.

The blue light cutting filter 325 may include any material capable of obtaining the above-described effects, and as one example, may include a yellow color filter. The blue light cutting filter 325 may have a stacked structure of a single layer or multiple layers.

When the blue light cutting filter 325 with the material for the yellow color filter is included, the display device may display yellow light due to external light reflection. According to an exemplary embodiment, the anti-reflective layer 400 includes a dye that absorbs light having a wavelength displaying the yellow light, so the phenomenon that the display device displays the yellow light may be reduced.

In the present specification, the blue light cutting filter 325 contacting the substrate 310 is shown, but the inventive concept is not limited thereto, and a separate buffer layer may be positioned between the substrate 310 and the blue light cutting filter 325.

The plurality of the color conversion layers 330R and 330G and the transmissive layer 330B may be positioned between the substrate 310 and the thin film transistor array panel 100. The plurality of the color conversion layers 330R and 330G and the transmissive layer 330B may be arranged along the first direction.

The plurality of the color conversion layers 330R and 330G may convert incident light into light having a different wavelength from that of the incident light, and emit the converted light. The plurality of the color conversion layers 330R and 330G may include the red color conversion layer 330R and the green color conversion layer 330G.

The incident light is not converted in the transmissive layer 330B, and the incident light may be emitted as it is. As an example, blue light may be incident on the transmissive layer 330B, and may be emitted as it is.

The red color conversion layer 330R may include the first semiconductor nanocrystal 331R that converts incident blue light into red light. The first semiconductor nanocrystal 331R may include at least one of a phosphor and a quantum dot.

The green color conversion layer 330G may include the second semiconductor nanocrystal 331G that coverts incident blue light into green light. The second semiconductor nanocrystal 331G may include at least one of a phosphor and a quantum dot.

The quantum dot included in the first semiconductor nanocrystal 331R and the second semiconductor nanocrystal 331G may be independently selected from a Group II-VI compound, a Group III-V compound, a Group IV-VI compound, a Group IV element, a Group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, hiAlNAs, InAlNSb, InAlPAs, InAlPSb, and a mixture thereof. The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles at uniform concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved. In addition, since light emitted through the quantum dot is emitted in all directions, a viewing angle of light may be improved.

When the first semiconductor nanocrystal 331R includes a red phosphor, the red phosphor may include at least one selected from a group including (Ca, Sr, Ba)S, (Ca, Sr, Ba)$_2$Si$_5$N$_8$, CaAlSiN$_3$, CaMoO$_4$, and Eu$_2$Si$_5$N$_8$, and but the present disclosure is not limited thereto.

When the second semiconductor nanocrystal 331G includes a green phosphor, the green phosphor may include at least one selected from a group including yttrium aluminum garnet (YAG), (Ca, Sr, Ba)$_2$SiO$_4$, SrGa2S4, BAM, α-SiAlON, β-SiAlON, Ca$_3$Sc$_2$Si$_3$O$_{12}$, Tb$_3$Al$_5$O$_{12}$, BaSiO$_4$, CaAlSiON, and (Sr(1-x)Ba$_x$)Si$_2$O$_2$N$_2$, but the present disclosure is not limited thereto. The x may be any number between 0 and 1.

The transmissive layer 330B may pass incident light without conversion. The transmissive layer 330B may include a resin passing blue light. The transmissive layer 330B positioned at the region emitting the blue light does not include the separate semiconductor nanocrystal, and passes the incident blue as it is.

Although not shown, the transmissive layer 330B may further include at least one of a dye and a pigment. The transmissive layer 330B including the dye or pigment may reduce the external light reflection, and may provide the blue light with improved color purity.

At least one of the red color conversion layer 330R, the green color conversion layer 330G, and the transmissive layer 330B may further include scatterers 332. Contents of respective scatterers 332 included in the red color conversion layer 330R, the green color conversion layer 330G, and the transmissive layer 330B may be different.

The scatterers 332 may increase an amount of light that is converted in or passes through the color conversion layers 330R and 330G and the transmissive layer 330B and then is emitted, and may uniformly provide front luminance and lateral luminance.

The scatterer 332 may include any material capable of evenly scattering incident light. As an example, the scatterer 332 may include at least one among TiO$_2$, ZrO$_2$, Al$_2$O$_3$, In$_2$O$_3$, ZnO, SnO$_2$, Sb$_2$O$_3$, and ITO.

As one example, the red color conversion layer 330R, the green color conversion layer 330G, and the transmissive layer 330B my include a photosensitive resin, and may be formed through a photolithography process. In addition, they may be formed through a printing process or an inkjet process, and in the case of these processes, the red color conversion layer 330R, the green color conversion layer 330G, and the transmissive layer 330B may include a material that is not the photosensitive resin. In the present specification, although it is described that the color conversion layer and the transmissive layer are formed through the photolithography process, the printing process, or the inkjet process, the inventive concept is not limited thereto.

A light filter layer 340 is positioned between the color conversion layers 330R and 330G and an over-coating layer 350, and between the transmissive layer 330B and the over-coating layer 350.

The light filter layer 340 may be a filter transmitting light of a predetermined wavelength, and reflecting or absorbing light except for that of the predetermined wavelength. The light filter layer 340 may have a structure in which layers having a high refractive index and layers having a low refractive index are alternately stacked, and may utilize reinforcement and/or offsetting interference between these layers to transmit and/or reflect the predetermined wavelength as above-described.

The light filter layer 340 may include at least one of TiO$_2$, SiN$_x$, SiO$_y$, TiN, Al$_2$O$_3$, SnO$_2$, WO$_3$, and ZrO$_2$, and as one example, it may have a structure in which SiN$_x$ and SiO$_y$ are alternately stacked. The x and y may be adjusted according to process conditions for forming the layers as factors for determining a chemical composition ratio in SiN$_x$ and SiO$_y$.

In some exemplary embodiments, the light filter layer 340 may be omitted, and it may be replaced with a low refractive layer or the like.

The over-coating layer 350 is positioned between the light filter layer 340 and the thin film transistor array panel 100. The over-coating layer 350 may overlap a front surface of the substrate 310.

The over-coating layer 350 may flatten a surface of one of the red color conversion layer 330R, the green color conversion layer 330G, and the transmissive layer 330B. The over-coating layer 350 includes an organic material, but is not limited thereto, and may include any material having the flattening function.

A second polarization layer 22 may be positioned between the over-coating layer 350 and the liquid crystal layer 3. The second polarization layer 22 may be at least one of a deposited polarization layer, a coated polarization layer, and a wire grid polarization layer, but is not limited thereto, and the second polarization layer 22 may be a wire grid polarization layer including a metal pattern as one example. The second polarization layer 22 may be formed between the over-coating layer 350 and the liquid crystal layer 3 by various methods such as the film type, the coating type, the printing type, and the like. When the second polarization layer 22 is the wire grid polarization layer, the second polarization layer 22 may include a plurality of bars having a width of several nanometers.

An insulating layer 360, a common electrode 370, and a second alignment layer 21 are positioned between the second polarization layer 22 and the liquid crystal layer 3.

The insulating layer 360 as a layer insulating the second polarization layer 22 and the common electrode 370 of the metal material may be omitted when the second polarization layer 22 is not the metal material. The common electrode 370 receiving the common voltage may form an electric field with the above-described pixel electrode 191. The configuration in which the common electrode 370 is positioned in a different display panel from that of the pixel electrode 191 is described in the present specification, but is not limited thereto, and they may be included in the same display panel.

The liquid crystal layer 3 is positioned between the thin film transistor array panel 100 and the color conversion display panel 300, and includes a plurality of liquid crystal molecules 31. It is possible to control transmittance of the light received from the light unit 500 according to a degree of movement of the liquid crystal molecules 31 and the like.

Figure 3:
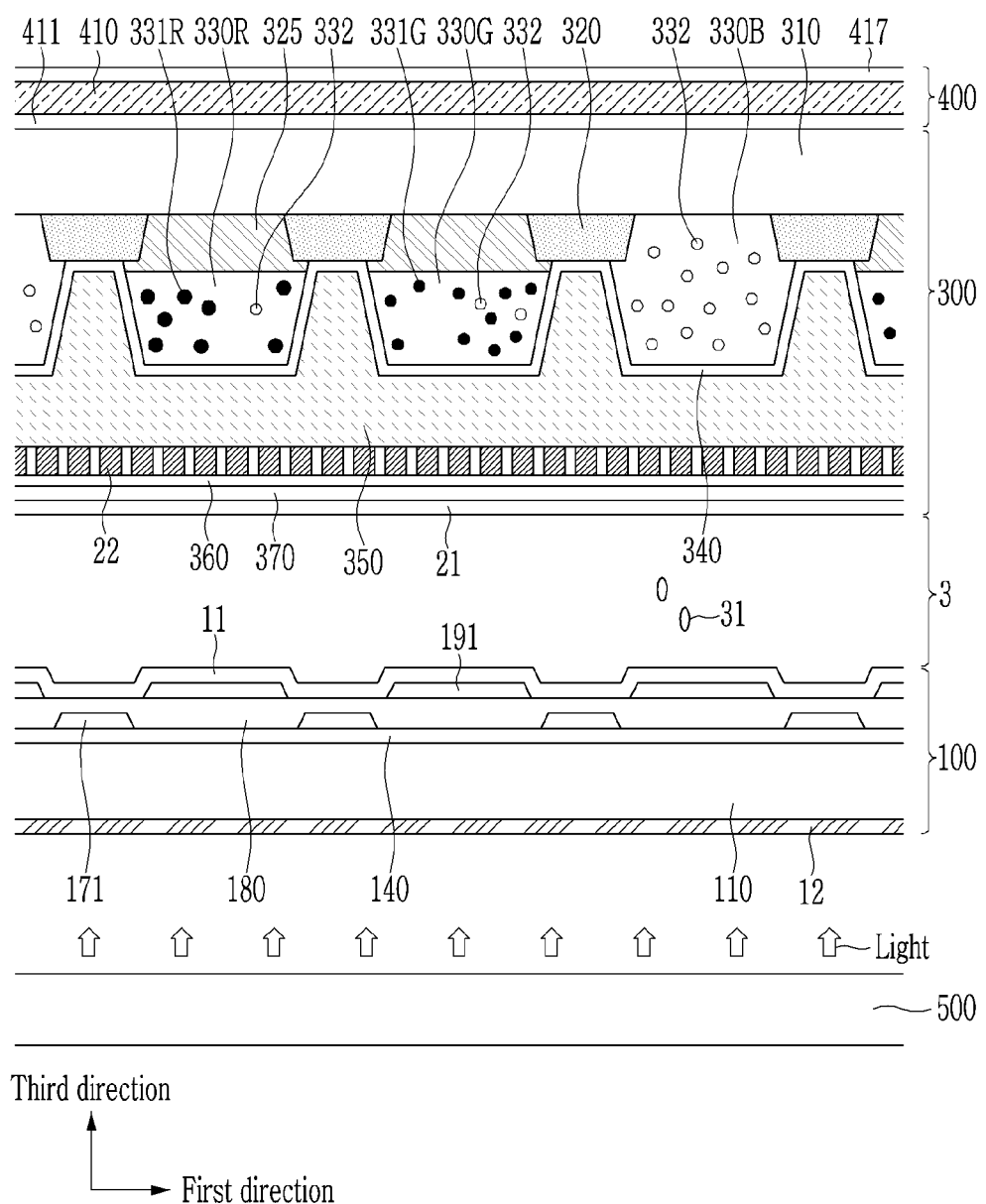
FIG. 3, FIG. 4, and FIG. 5 illustrate cross-sectional views of modified exemplary embodiments of FIG. 2.
Figure 4:
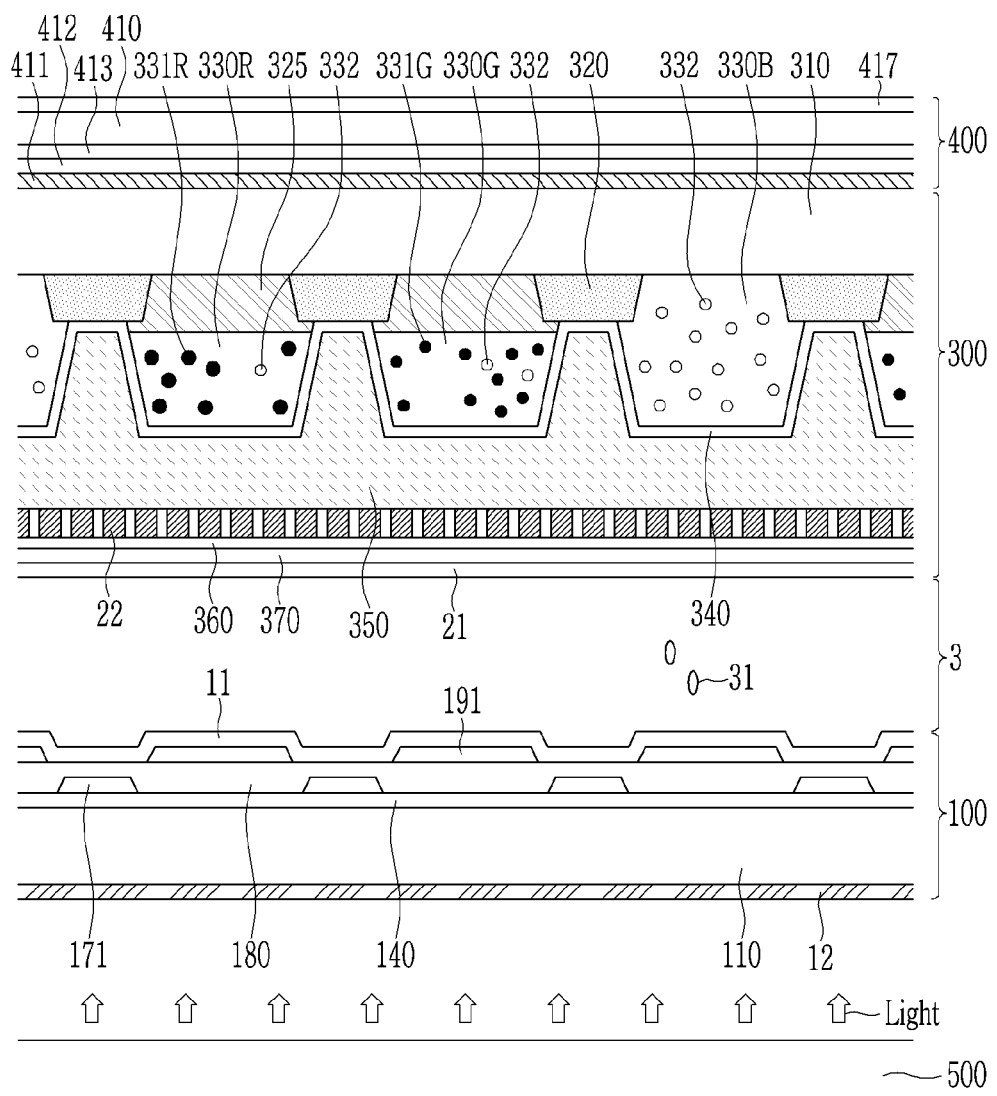
Figure 5:
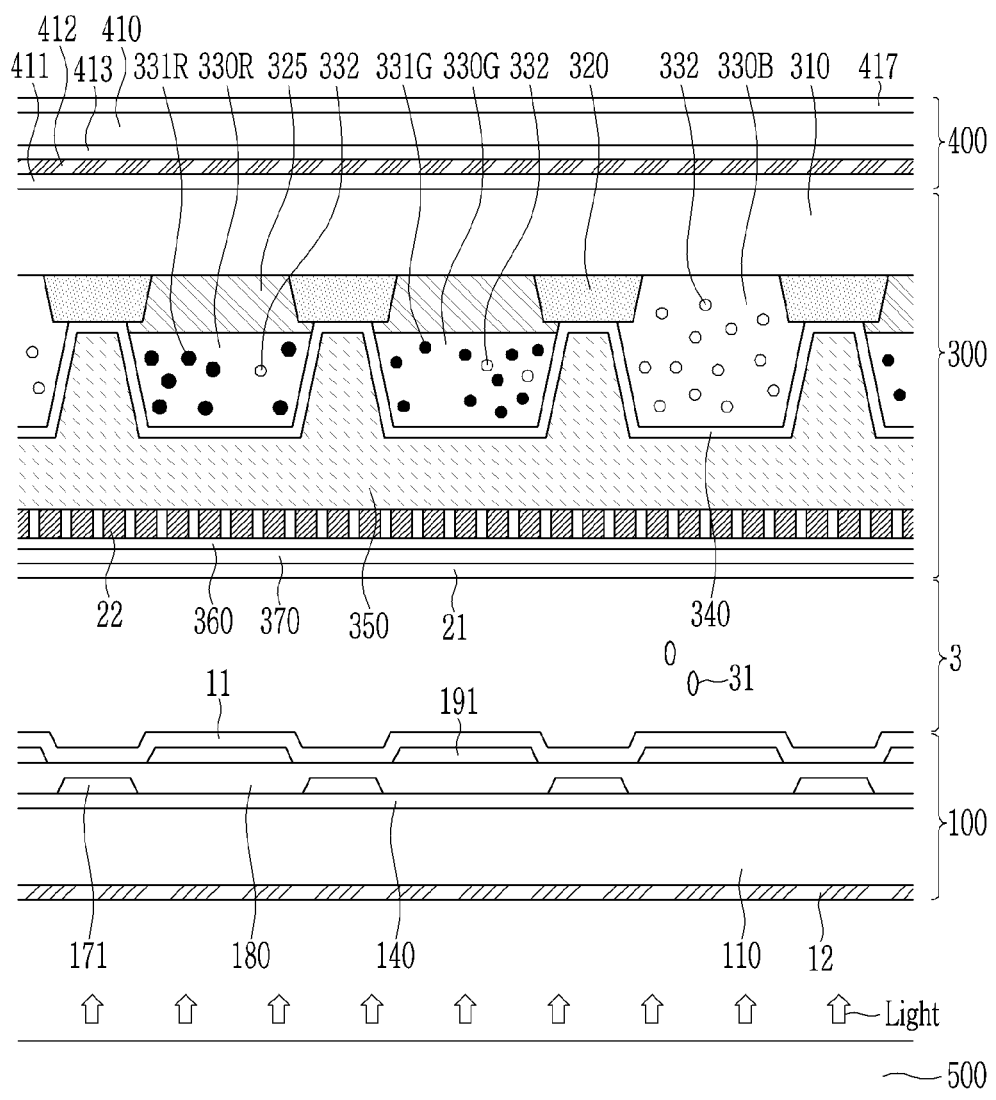

Hereinafter, exemplary embodiments will be described with reference to FIG. 3 to FIG. 5. FIG. 3, FIG. 4, and FIG. 5 illustrate cross-sectional views of modified exemplary embodiments of FIG. 2. A description for constituent elements that are identical or similar to those of the above-described exemplary embodiments will be omitted.

Referring to FIG. 3, the anti-reflective layer 400 is positioned on the substrate 310. The anti-reflective layer 400 includes the adhesive layer 411, the base film 410, and the low-reflective layer 417 overlapping the front surface of the substrate 310. The adhesive layer 411 may combine the base film 410 and the substrate 310.

The base film 410 may support the low-reflective layer 417. The base film 410 may include a polymer for supporting the low-reflective layer 417, and in some exemplary embodiments, it may include a dye absorbing light of some wavelengths.

The dye absorbs light of a peripheral wavelength band except for a central wavelength band of light emitted from the color conversion display panel 300 according to the embodiment, thereby providing light having better color reproducibility.

Specifically, a central wavelength of blue light emitted from the color conversion display panel 300 may be about 450 nm to about 460 nm, a central wavelength of green light may be about 540 nm to about 550 nm, and a central wavelength of red light may be about 630 nm to about 640 nm. The dye included in the base film 410 may absorb the light having the first wavelength of 480 nm to 520 nm, the light having the second wavelength of 580 nm to 620 nm, and the light having the third wavelength of 680 nm to 720 nm.

The dye may include at least one of the first dye absorbing the light having the first wavelength, the second dye absorbing the light having the second wavelength, and the third dye absorbing the light having the third wavelength. The base film 410 absorbs the light of the peripheral wavelength band such as the first wavelength to the third wavelength except for the central wavelength of the light emitted from the color conversion display panel 300, and thereby allows light transmittance in the first to third wavelength bands to be 80% or less.

The dye included in the base film 410 may include at least one of the compounds represented by Chemical Formulas 1 to 7. Particularly, the compound represented by Chemical Formulas 1 and 2 may be the first dye absorbing the light having the first wavelength, the compound represented by Chemical Formulas 3 and 4 may be the second dye absorbing the light having the second wavelength, and the compound represented by Chemical Formulas 5 and 6 may be the third dye absorbing the light having the third wavelength.

The compound represented by Chemical Formula 7 may be the second dye absorbing the light having the second wavelength. Although not shown, the compound represented by Chemical Formula 7 may absorb the light having the first wavelength or the light having the third wavelength by adjusting the number of double bonds included in the compound.

The second dye may be included in the base film 410 at a larger weight percentage than the first dye and the third dye. Specifically, the weight ratio of the second dye to the first dye may be about 5:1 to about 5:2, and the weight ratio of the second dye to the third dye may be about 5:1 to about 5:2.

Since the color conversion display panel 300 according to the exemplary embodiment may include the blue light cutting filter 325 including the yellow filter, the display area may display the yellow light. Since the second dye absorbing the light having the wavelength displaying the yellow color is included at a larger content than the first dye and the third dye, the second dye may absorb the yellow light emitted to the outside of the display device, and it is possible to reduce the phenomenon that the yellow light appears in the display area.

Although the exemplary embodiment in which the second dye is contained at more than the first dye and the third dye to reduce the phenomenon that the display device displays the yellow light in the present specification, the inventive concept is not limited thereto, and in some exemplary embodiments, an amount of the first dye may be the largest or an amount of the third dye may be the largest.

The low-reflective layer 417 is positioned on the base film 410. For example, the low-reflective layer 417 may have a structure in which a plurality of layers having different refractive indexes are stacked to reduce reflection of external light.

Referring to FIG. 4, the anti-reflective layer 400 is positioned on the substrate 310. The anti-reflective layer 400 according to the exemplary embodiment may include the adhesive layer 411, a phase retardation layer 412, a linear polarization layer 413, the base film 410, and the low-reflective layer 417 that are stacked along the third direction.

The adhesive layer 411 may combine the substrate 310 and the phase retardation layer 412. At the same time, the adhesive layer 411 absorbs the light of the peripheral wavelength band except for the central wavelength band of the light emitted from the color conversion display panel 300, thereby providing light with better color reproducibility. The adhesive layer 411 is the same as the adhesive layer 411 described with reference to FIG. 2, so a description thereof will be omitted hereinafter.

The phase retardation layer 412 may change circular polarization to linear polarization or linear polarization to circular polarization by applying 0.21/4 retardation. The phase retardation layer 412 may be a polyethersulfone-based or cycloolefin-based polymer film, but is not limited thereto.

The linear polarization layer 413 may be an iodine-based linear polarization layer in which an iodine compound is adsorption-aligned, or a dye-based linear polarizer in which dichroic dyes are adsorption-aligned.

External light incident from the outside enters a linearly polarized state while passing through the linear polarization layer 413, and it enters a circularly polarized state while passing through the phase retardation layer 412. The external light of the circularly polarized state is linearly polarized in a direction perpendicular to a transmissive axis direction of the linear polarization layer 413 while being reflected by the color conversion display panel 300 and passing through the phase retardation layer 412 again. Accordingly, the incident external light does not transmit through the anti-reflective layer 400 and is not emitted to the outside. Thus, it is possible to reduce the external light reflection of the display device.

In addition, the exemplary embodiment in which the phase retardation layer 412 is positioned between the adhesive layer 411 and the linear polarization layer 413 is described in the present specification. However, the inventive concept is not limited thereto, and the phase retardation layer 412 may be replaced with a base film.

The base film 410 and the low-reflective layer 417 may be positioned on the linear polarization layer 413. The base film 410 and the low-reflective layer 417 are the same as the base film 410 and the low-reflective layer 417 described with reference to FIG. 2, so a description thereof will be omitted hereinafter.

Then, referring to FIG. 5, the anti-reflective layer 400 is positioned on the substrate 310. The anti-reflective layer 400 may include the adhesive layer 411, the phase retardation layer 412, the linear polarization layer 413, the base film 410, and the low-reflective layer 417 that are stacked along the third direction.

The adhesive layer 411 may include any material for bonding the anti-reflective layer 400 and the substrate 310 while overlapping the front surface of the substrate 310. The adhesive layer 411 of FIG. 5 may be the same as the adhesive layer 411 of FIG. 3.

The phase retardation layer 412 may change circular polarization to linear polarization or linear polarization to circular polarization by applying λ/4 retardation. The phase retardation layer 412 may be a polyethersulfone-based or cycloolefin-based polymer film, but is not limited thereto.

The phase retardation layer 412 according to the exemplary embodiment may further include a dye. The dye absorbs light of a peripheral wavelength band except for a central wavelength band of light emitted from the color conversion display panel 300 according to the embodiment of the present disclosure, thereby providing light having better color reproducibility.

Specifically, a central wavelength of blue light emitted from the color conversion display panel 300 may be about 450 nm to about 460 nm, a central wavelength of green light may be about 540 nm to about 550 nm, and a central wavelength of red light may be about 630 nm to about 640 nm. The dye included in the adhesive layer 411 may absorb the light having the first wavelength of 480 nm to 520 nm, the light having the second wavelength of 580 nm to 620 nm, and the light having the third wavelength of 680 nm to 720 nm.

The dye may include at least one of the first dye absorbing the light having the first wavelength, the second dye absorbing the light having the second wavelength, and the third dye absorbing the light having the third wavelength. The phase retardation layer 412 absorbs the light of the peripheral wavelength band such as the first wavelength to the third wavelength except for the central wavelength of the light emitted from the color conversion display panel 300, and thereby allows light transmittance in the first to third wavelength bands to be 80% or less. Thus, since light concentrated in the central wavelength band is emitted, it is possible to provide light with improved color reproducibility.

The dye may include at least one of compounds represented by Chemical Formulas 1 to 7. Particularly, the compounds represented by Chemical Formulas 1 and 2 may be the first dye absorbing the light having the first wavelength, the compounds represented by Chemical Formulas 3 and 4 may be the second dye absorbing the light having the second wavelength, and the compounds represented by Chemical formulas 5 and 6 may be the third dye absorbing the light having the third wavelength.

The compound represented by Chemical Formula 7 may be the second dye absorbing the light having the second wavelength. Although not shown herein, the compound represented by Chemical Formula 7 may absorb the light having the first wavelength or the light having the third wavelength by controlling the number of double bonds included in the compound.

The second dye may be included in the phase retardation layer 412 at a larger weight percentage than the first dye and the third dye. Specifically, the weight ratio of the second dye to the first dye may be about 5:1 to about 5:2, and the weight ratio of the second dye to the third dye may be about 5:1 to about 5:2.

Although the exemplary embodiment in which the second dye is contained at more than the first dye and the third dye to reduce the phenomenon that the display device displays the yellow light in the present specification, the inventive concept is not limited thereto, and in some exemplary embodiments, an amount of the first dye may be the largest or an amount of the third dye may be the largest.

The linear polarization layer 413, the base film 410, and the low-reflective layer 417 are the same as the linear polarization layer 413, the base film 410, and the low-reflective layer 417 described with reference to FIG. 4, so a description thereof will be omitted hereinafter.

In addition, the exemplary embodiment in which the phase retardation layer 412 is positioned between the adhesive layer 411 and the linear polarization layer 413 is described in the present specification, but the inventive concept is not limited thereto, and the phase retardation layer 412 may be replaced with a base film including a dye.

Hereinafter, a display device according to an exemplary embodiment will be described with reference to FIG. 6. FIG.

6 is a graph showing an adsorption spectrum of the color conversion display panel and the anti-reflective plate according to the embodiment of the present invention.

Figure 6:
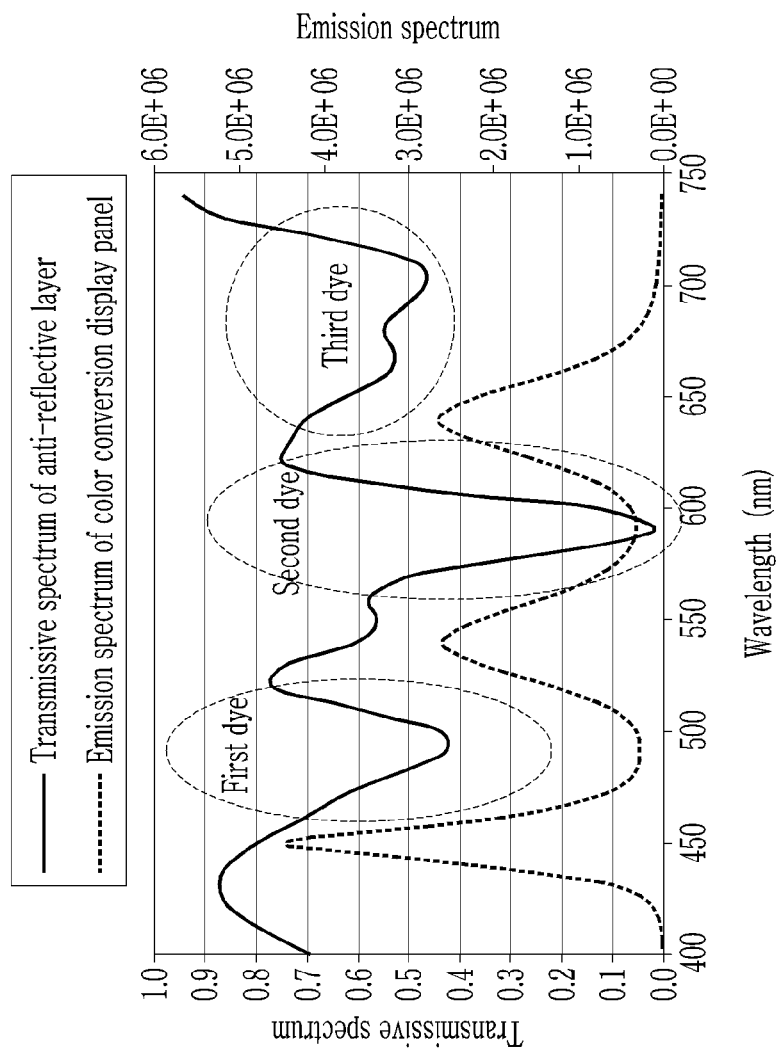
FIG. 6 is a graph showing an emission spectrum of a color conversion display panel and a transmissive spectrum of an anti-reflective plate according to an embodiment of the inventive concept.

Referring to FIG. 6, the color conversion display panel according to the exemplary embodiment of the present invention emits light having central wavelengths of about 455 nm, 545 nm, and 635 nm. When light having peripheral wavelengths positioned between the central wavelengths is effectively blocked, color reproducibility of the emitted light may be improved. The anti-reflective layer according to the exemplary embodiment includes a dye that absorbs light of peripheral wavelength bands positioned between the central wavelengths, thereby improving the color reproducibility of the display device.

Specifically, as shown in FIG. 6, the first dye included in the anti-reflective layer may absorb light having a wavelength of about 480 to about 520 nm, the second dye included in the anti-reflective layer may absorb light having a wavelength of about 580 to about 620 nm, and the first dye included in the anti-reflective layer may absorb light having a wavelength of about 680 to about 720, thus it is possible to implement prevention of the external light while minimizing luminance loss.

Particularly, the anti-reflective layer according to the exemplary embodiment includes the second dye at a larger weight percentage than the first dye and the third dye. Thus, since its absorption efficiency of the yellow light is excellent, the phenomenon that yellow light appears in the display device may be reduced.

Hereinafter, exemplary embodiments and comparative examples will be specifically described with reference to Table 1 to Table 3. Exemplary Embodiment 1 is a display device provided with an adhesive layer containing a dye according to the exemplary embodiment of FIG. 2, Comparative Example 1 is a display device including a linear polarization layer and a phase retardation layer positioned on a color conversion display panel, and Comparative Example 2 is a display device including a color conversion display panel without a separate anti-reflective layer.

Referring to Table 1, the transmittance efficiency of Exemplary Embodiment 1 was increased by about 7.4% compared to that of Comparative Example 1 including the linear polarization layer and the phase retardation layer, and it was confirmed that the transmittance thereof was improved by about 20% compared to that of Comparative Example 1.

TABLE 1

|  | Transmittance efficiency | Relative transmittance efficiency |
| --- | --- | --- |
| Comparative Example 1 | 43.9% | 100% |
| Exemplary Embodiment 1 | 51.3% | 117% |

In Table 2, a* is an index that indicates red as a positive value increase and indicates green as a negative value increases, and b* is an index that indicates yellow as a positive value increase and indicates blue as a negative value increases. As the values of a* and b* are closer to zero, it is possible to provide balanced color.

Referring to Table 2, in Comparative Example 1 and Comparative Example 2, it can be seen that the value of b* is particularly closer to yellow when the value of a* is closer to green. That is, it can be seen that Comparative Example 1 and Comparative Example 2 considerably indicate yellow. In contrast, in Exemplary Embodiment 1, it can be seen that the values of both a* and b* are −1, which is close to zero. It was confirmed that Exemplary Example 1 displayed a balanced color tone compared to Comparative Example 1 and Comparative Example 2.

In addition, regarding Y % indicating reflectance, it was confirmed that Exemplary Example 1 realized significantly improved external light reflection reduction effect as compared to Comparative Example 2, and had a reflection degree close to that of Comparative Example 1 including the polarization layer.

TABLE 2

|  | Y % | a* | b* |
| --- | --- | --- | --- |
| Exemplary Embodiment 1 | 5.0% | −1 | −1 |
| Comparative Example 1 | 3.4% | −6 | 12 |
| Comparative Example 2 | 20.9% | −4 | 17 |

Referring to Table 3, the color coordinate matching ratio of Exemplary Example 1 was about 95.8%, while the color coordinate matching ratios of Comparative Example 1 and Comparative Example 2 were about 92%. It was confirmed that the anti-reflective layer according to Exemplary Example 1 might provide the improved color reproducibility when including the dye.

TABLE 3

|  | CIE color coordinate matching ratio |
| --- | --- |
| Exemplary Embodiment 1 | 95.8% |
| Comparative Example 1 | 91.9% |
| Comparative Example 2 | 91.9% |

It can be seen that since the display device according to the exemplary embodiment of the present disclosure includes the anti-reflective layer including the dye, it is possible to improve the color reproducibility while reducing the reflection of the external light even when the linear polarization layer and the phase retardation layer are not included therein.

While this inventive concept has been described in connection with what is presently considered to be practical exemplary embodiments, it is to be understood that the inventive concept is not limited to the disclosed embodiments but, on the contrary, is intended to cover various modifications and equivalent arrangements included within the spirit and scope of the appended claims.

DESCRIPTION OF SYMBOLS

100: thin film transistor array panel
300: color conversion display panel
400: anti-reflective layer
411: adhesive layer
410: base film
417: low-reflective layer
330R, 330G: color conversion layer
330B: transmissive layer

What is claimed is:
1. A display device comprising:
a thin film transistor array panel;
an anti-reflective layer on the thin film transistor array panel; and a color conversion display panel positioned between the thin film transistor array panel and the anti-reflective layer, wherein: the color conversion display panel includes a color conversion layer including a semiconductor nanocrystal and a transmissive layer;

the anti-reflective layer includes:

an adhesive layer positioned on the color conversion display panel, a low-reflective layer on the adhesive layer, and a base film positioned between the adhesive layer and the low-reflective layer; and a dye in the anti-reflective layer, wherein the dye includes at least one of a first dye absorbing light having a wavelength of 480 nm to 520 nm, a second dye absorbing light having a wavelength of 580 nm to 620 nm, and a third dye absorbing light having a wavelength of 680 nm to 720 nm, and wherein a weight percentage of the second dye included in the anti-reflective layer is larger than those of the first dye and the third dye.

2. The display device of claim 1, wherein the color conversion display panel emits blue light including a wavelength of 450 nm to 460 nm, green light including a wavelength of 540 nm to 550 nm, and red light including a wavelength of 630 nm to 640 nm.

3. The display device of claim 2, wherein a weight ratio of the second dye and the first dye included in the anti-reflective layer is 5:1 to 5:2.

4. The display device of claim 2, wherein a weight ratio of the second dye and the third dye included in the anti-reflective layer is 5:1 to 5:2.

5. The display device of claim 1, wherein the anti-reflective layer includes a phase retardation layer and a linear polarization layer positioned between the adhesive layer and the base film.

6. The display device of claim 5, wherein the adhesive layer includes the dye.

7. The display device of claim 5, wherein the phase retardation layer includes the dye.

8. A display device comprising:

a thin film transistor array panel;

an anti-reflective layer on the thin film transistor array panel; and a color conversion display panel positioned between the thin film transistor array panel and the anti-reflective layer, wherein: the color conversion display panel includes a color conversion layer including a semiconductor nanocrystal and a transmissive layer;

the anti-reflective layer includes:

an adhesive layer positioned on the color conversion display panel, a low-reflective layer on the adhesive layer, and a base film positioned between the adhesive layer and the low-reflective layer; and a dye in the anti-reflective layer, wherein the dye includes at least one of compounds represented by Chemical Formulas 1 to 7:

[Chemical Formula 1]
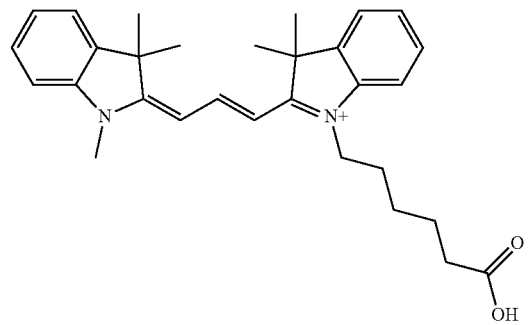

[Chemical Formula 2]
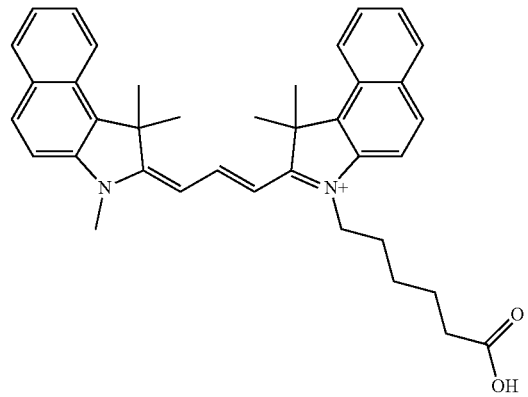

[Chemical Formula 3]
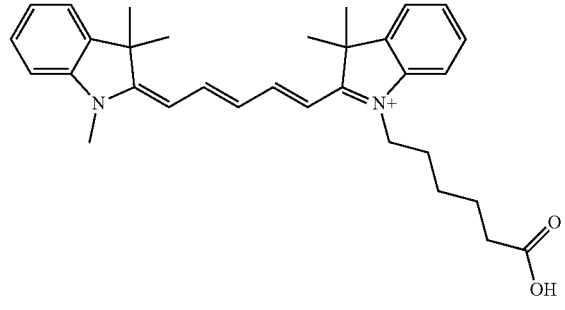

[Chemical Formula 4]
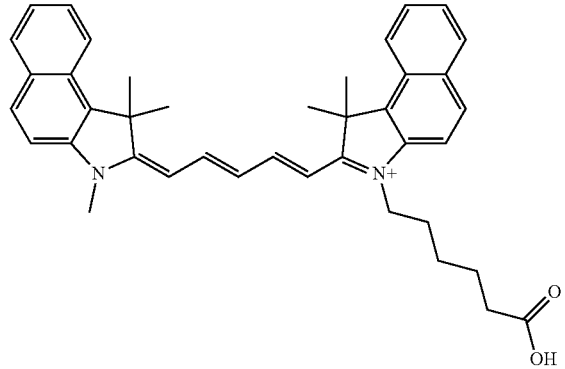

-continued

[Chemical Formula 5]

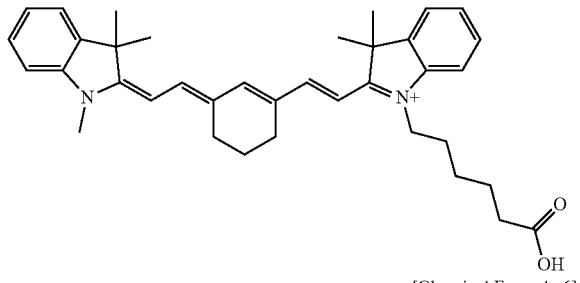

[Chemical Formula 6]

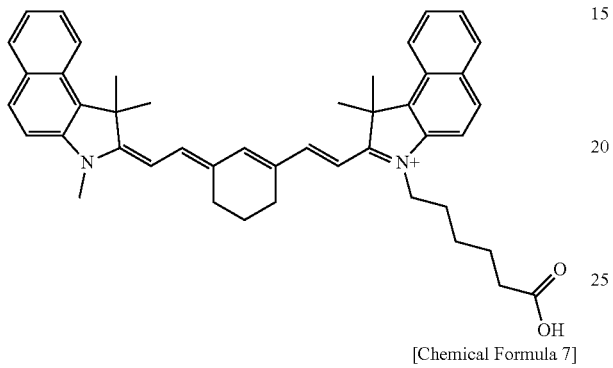

[Chemical Formula 7]

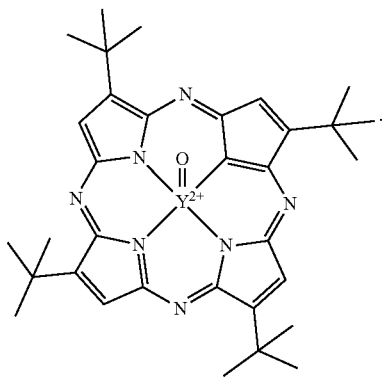

9. A display device comprising:
a thin film transistor array panel;
an anti-reflective layer on the thin film transistor array panel; and
a color conversion display panel positioned between the thin film transistor array panel and the anti-reflective layer,
wherein: the color conversion display panel includes a color conversion layer including a semiconductor nanocrystal and a transmissive layer;
the anti-reflective layer includes
an adhesive layer positioned on the color conversion display panel,
a low-reflective layer on the adhesive layer, and
a base film positioned between the adhesive layer and the low-reflective layer; and
the anti-reflective layer absorbs light having a first wavelength of 480 nm to 520 nm, light having a second wavelength of 580 nm to 620 nm, and light having a third wavelength of 680 nm to 720 nm.

10. The display device of claim 9, wherein
the color conversion display panel emits
blue light including a wavelength of 450 nm to 460 nm,
green light including a wavelength of 540 nm to 550 nm, and
red light including a wavelength of 630 nm to 640 nm.

11. The display device of claim 9, wherein
at least one of a plurality of layers included in the anti-reflective layer includes a dye, and
the dye includes at least one of a first dye absorbing the light having the first wavelength, a second dye absorbing the light having the second wavelength, and a third dye absorbing the light having the third wavelength.

12. The display device of claim 11, wherein
the dye includes at least one of compounds represented by Chemical Formulas 1 to 7:

[Chemical Formula 1]

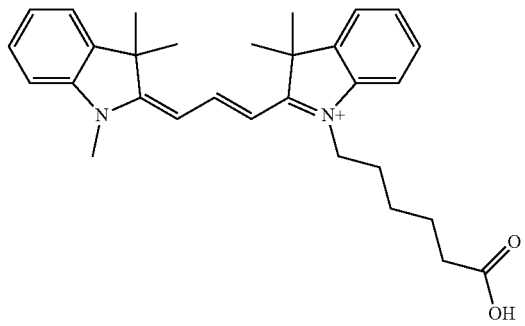

[Chemical Formula 2]

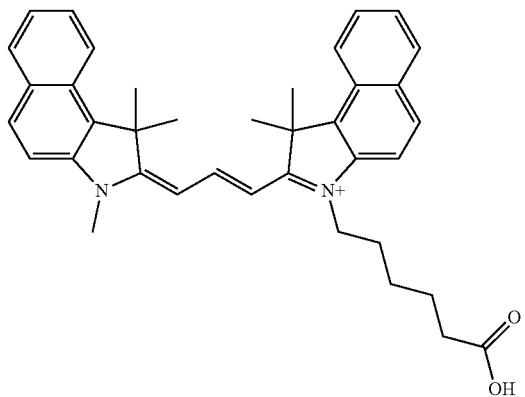

[Chemical Formula 3]

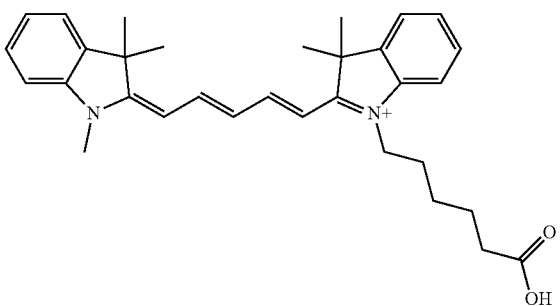

[Chemical Formula 4]

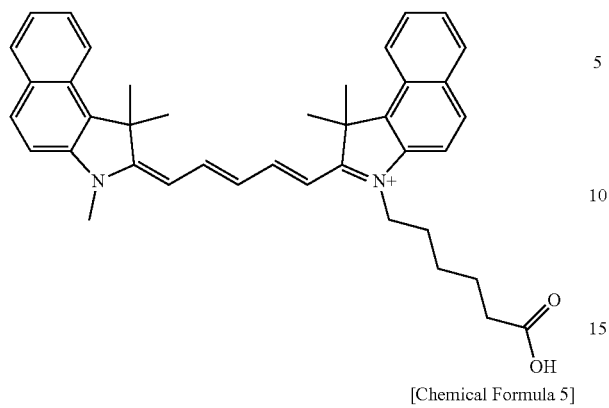

[Chemical Formula 5]

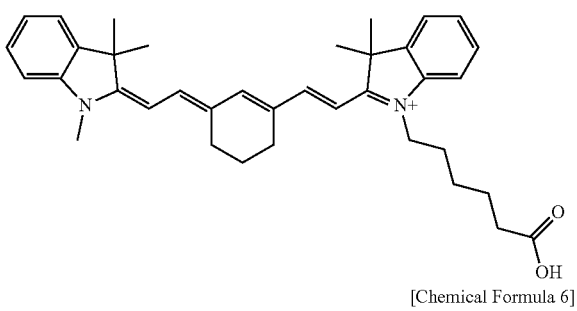

[Chemical Formula 6]

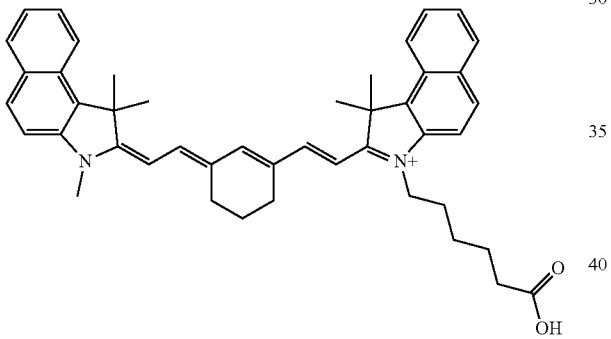

[Chemical Formula 7]

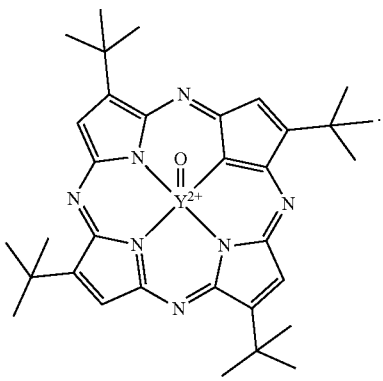

13. The display device of claim 11, wherein
a weight percentage of the second dye included in the anti-reflective layer is larger than those of the first dye and the third dye.

14. The display device of claim 11, wherein
a weight ratio of the second dye and the first dye included in the anti-reflective layer is 5:1 to 5:2.

15. The display device of claim 11, wherein
a weight ratio of the second dye and the third dye included in the anti-reflective layer is 5:1 to 5:2.

16. The display device of claim 11, wherein
the anti-reflective layer includes a phase retardation layer and a linear polarization layer positioned between the adhesive layer and the base film.

17. The display device of claim 16, wherein
the phase retardation layer includes the dye.

18. The display device of claim 16, wherein
the adhesive layer includes the dye.

* * * * *